(12) United States Patent
Liu et al.

(10) Patent No.: US 11,594,459 B2
(45) Date of Patent: Feb. 28, 2023

(54) PASSIVATION LAYER FOR A SEMICONDUCTOR DEVICE AND METHOD FOR MANUFACTURING THE SAME

(71) Applicant: Taiwan Semiconductor Manufacturing Company, Ltd., Hsinchu (TW)

(72) Inventors: Li Chun Liu, Kaohsiung (TW); Chun Tang Wang, Tainan (TW); Chih Hung Wang, Taipei (TW); Ching Feng Lee, Tainan (TW); Yu-Lung Yeh, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 121 days.

(21) Appl. No.: 17/248,879

(22) Filed: Feb. 11, 2021

(65) Prior Publication Data
US 2022/0254697 A1    Aug. 11, 2022

(51) Int. Cl.
| | |
|---|---|
| H01L 21/00 | (2006.01) |
| H01L 23/31 | (2006.01) |
| H01L 21/768 | (2006.01) |
| H01L 23/528 | (2006.01) |

(52) U.S. Cl.
CPC .... *H01L 23/3171* (2013.01); *H01L 21/76832* (2013.01); *H01L 21/76834* (2013.01); *H01L 23/528* (2013.01)

(58) Field of Classification Search
CPC ........... H01L 23/3171; H01L 21/76832; H01L 21/76834
See application file for complete search history.

(56) References Cited

U.S. PATENT DOCUMENTS 6,756,671 B2 * 6/2004 Lee ............... H01L 21/76804
257/737
8,441,124 B2 * 5/2013 Wu ............... H01L 23/49811
257/781

(Continued)

FOREIGN PATENT DOCUMENTS

CN    102683321 A  *  9/2012  ....... H01L 21/76832
CN    102683321 B  *  8/2016  ....... H01L 21/76832

(Continued)

OTHER PUBLICATIONS

Japanese Office Action issued in Japanese Application No. 11020782630; dated Aug. 13, 2021, 5 Pages.

*Primary Examiner* — Laura M Menz
(74) *Attorney, Agent, or Firm* — Harrity & Harrity, LLP (57) ABSTRACT

A semiconductor device includes an ultra-thick metal (UTM) structure. The semiconductor device includes a passivation layer including a first passivation oxide. The first passivation oxide includes an unbias film and a first bias film, where the unbias film is on portions of the UTM structure and on portions of a layer on which the UTM structure is formed, and the first bias film is on the unbias film. The passivation layer includes a second passivation oxide consisting of a second bias film, the second bias film being on the first bias film. The passivation layer includes a third passivation oxide consisting of a third bias film, the third bias film being on the second bias film.

20 Claims, 10 Drawing Sheets

(56) References Cited

U.S. PATENT DOCUMENTS

| | | | | |
|---|---|---|---|---|
| 8,860,224 B2* | 10/2014 | Chen | ................... | H01L 23/5227 |
| | | | | 257/E23.141 |
| 9,406,629 B2* | 8/2016 | Tseng | ................... | H01L 23/3171 |
| 9,524,944 B2* | 12/2016 | Yeh | ......................... | H01L 24/05 |
| 9,595,492 B2 | 3/2017 | Liu | ................... | H01L 21/76816 |
| 9,966,302 B2* | 5/2018 | Liu | ................... | H01L 21/76807 |
| 11,469,169 B2* | 10/2022 | Mun | ................... | H01L 21/76283 |
| 2004/0004284 A1* | 1/2004 | Lee | ..................... | H01L 23/5226 |
| | | | | 438/618 |
| 2012/0181657 A1* | 7/2012 | Wu | ................... | H01L 27/10852 |
| | | | | 257/532 |
| 2012/0190152 A1* | 7/2012 | Chen | ........................ | H01G 4/30 |
| | | | | 257/E21.599 |
| 2012/0217641 A1* | 8/2012 | Chen | ................... | H01L 23/5227 |
| | | | | 257/734 |
| 2013/0328116 A1* | 12/2013 | Chang | .................... | B82Y 10/00 |
| | | | | 257/E27.092 |
| 2014/0038384 A1* | 2/2014 | Wu | ......................... | H01L 28/88 |
| | | | | 438/399 |
| 2014/0080298 A1* | 3/2014 | Jee | ........................ | H01L 27/115 |
| | | | | 438/652 |
| 2017/0080298 A1 | 3/2017 | Yadav | | |
| 2018/0033905 A1* | 2/2018 | Augusto | ............ | H01L 31/1868 |
| 2018/0301414 A1* | 10/2018 | Stecher | ............. | H01L 21/76838 |
| 2020/0051812 A1 | 2/2020 | Belyansky et al. | | |
| 2022/0246534 A1* | 8/2022 | Chin | .................... | H01L 21/76834 |
| 2022/0254697 A1* | 8/2022 | Liu | ................... | H01L 21/76837 |
| 2022/0320004 A1* | 10/2022 | Chang | ................... | H01L 23/552 |
| 2022/0320300 A1* | 10/2022 | Hsiung | ............... | H01L 23/5283 |

FOREIGN PATENT DOCUMENTS

| | | | | | |
|---|---|---|---|---|---|
| CN | 114551370 A | * | 5/2022 | ....... | H01L 21/76832 |
| CN | 114597163 A | * | 6/2022 | ....... | H01L 21/76807 |
| CN | 114823330 A | * | 7/2022 | ....... | H01L 21/32136 |
| GB | 2494008 A | * | 2/2013 | ........... | H01S 5/0282 |
| JP | 2022047357 A | * | 3/2022 | ....... | H01L 21/02126 |
| TW | 201138042 A | | 11/2011 | | |
| TW | 201444045 A | | 11/2014 | | |
| TW | 201626539 A | | 7/2016 | | |

\* cited by examiner

PASSIVATION LAYER FOR A SEMICONDUCTOR DEVICE AND METHOD FOR MANUFACTURING THE SAME

BACKGROUND

A semiconductor device may include a passivation layer. The passivation layer may serve to protect other (lower) layers or elements of the semiconductor device from damage. The passivation layer may be formed, for example, after completion of metallization of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device may include an ultra-thick metal (UTM) structure to, for example, reduce resistance of metal lines of the semiconductor device. With the reduced resistance, the performance of integrated circuit devices, such as inductors, may be improved to satisfy requirements in a given application. Portions of a UTM structure are typically covered with a passivation layer to protect the UTM structure and other (lower) layers of the semiconductor device. The passivation layer typically includes a first dual film passivation oxide, a second dual film passivation oxide, and a third dual film passivation oxide, where each dual film passivation oxide includes an unbias film and a bias film. That is, the first dual film passivation oxide typically includes a first unbias film (on the UTM structure and on portions of a layer on which the UTM structure is formed, such as a dielectric layer) and a first bias film (on the first unbias film), the second dual film passivation oxide typically includes a second unbias film (on the first bias film) and a second bias film (on the second unbias film), and the third dual film passivation oxide typically includes a third unbias film (on the second bias film) and a third bias film (on the third unbias film).

Notably, the above-described passivation layer design means that there are numerous interfaces in the passivation layer, namely an interface between the first unbias film and the first bias film, an interface between the first bias film and the second unbias film, an interface between the second unbias film and the second bias film, an interface between the second bias film and the third unbias film, and an interface between the third unbias film and the third bias film. In general, an unbias film is a comparatively more porous film than a bias film and, therefore, has a weaker tensile resistance. Further, an interface between an unbias film and a bias film is more likely to lead to cracking (e.g., as compared to an interface between two bias films) due to the difference in film stresses and adhesion characteristics of the different films.

Additionally, some of the interfaces between films in the above-described passivation layer structure are near a point of stress concentration of a given portion of the UTM structure. Such interfaces being near the point of stress concentration of a portion of the UTM structure increases a likelihood of cracking within the semiconductor device. For example, a semiconductor manufacturing process performed after formation of the passivation layer and at a relatively high temperature can cause portions of the UTM structure and the passivation layer to contract in opposing directions. Contraction of the UTM and the passivation layer in opposing directions induces tensile stress along a height of the portion of the UTM structure. Here, a point of stress concentration of the portion of the UTM structure (e.g., a point at which the tensile stress is highest) is near a center of the portion of the UTM structure along the height of the portion of the UTM structure. Thus, interfaces between films of the passivation layer being near the point of stress concentration (particularly an interface including an unbias film) results in an increased likelihood of cracking in the passivation layer, meaning that a yield associated with manufacturing the semiconductor device is lowered. Notably, in some practical applications, a pattern of cracking in the passivation layer follows a layout of the UTM structure.

Some implementations described herein provide an improved passivation layer for a semiconductor device. In some implementations, the improved passivation layer includes a first passivation oxide, a second passivation oxide, and a third passivation oxide. In some implementations, the first passivation oxide includes an unbias film (on the UTM structure and on portions of a layer on which the UTM structure is formed, such as a dielectric layer) and a first bias film (on the first unbias film). In some implementations, the second passivation oxide consists of a second unbias film (on the first bias film), and the third passivation oxide consists of a third unbias film (on the second unbias film). Notably, the improved passivation layer does not include a second bias film or a third bias film (as in the related passivation layer described above). That is, in some implementations, the second passivation oxide and the third passivation oxide are single films (rather than dual films as in the related passivation layer structure described above).

In some implementations, the improved passivation layer is structured such that a number of unbias films is reduced and such that a number interfaces between films is minimized. Further, in some implementations, the improved passivation layer is structured such that interfaces between films are comparatively further from a point of stress concentration (e.g., as compared to the related passivation layer described above). As a result, a likelihood of cracking is reduced, thereby increasing a yield associated with manufacturing the semiconductor device. Further, in some implementations, the improved passivation layer is structured such that a likelihood of the portions of the UTM structure being damaged during a subsequent semiconductor processing step is reduced.

Figure 1:
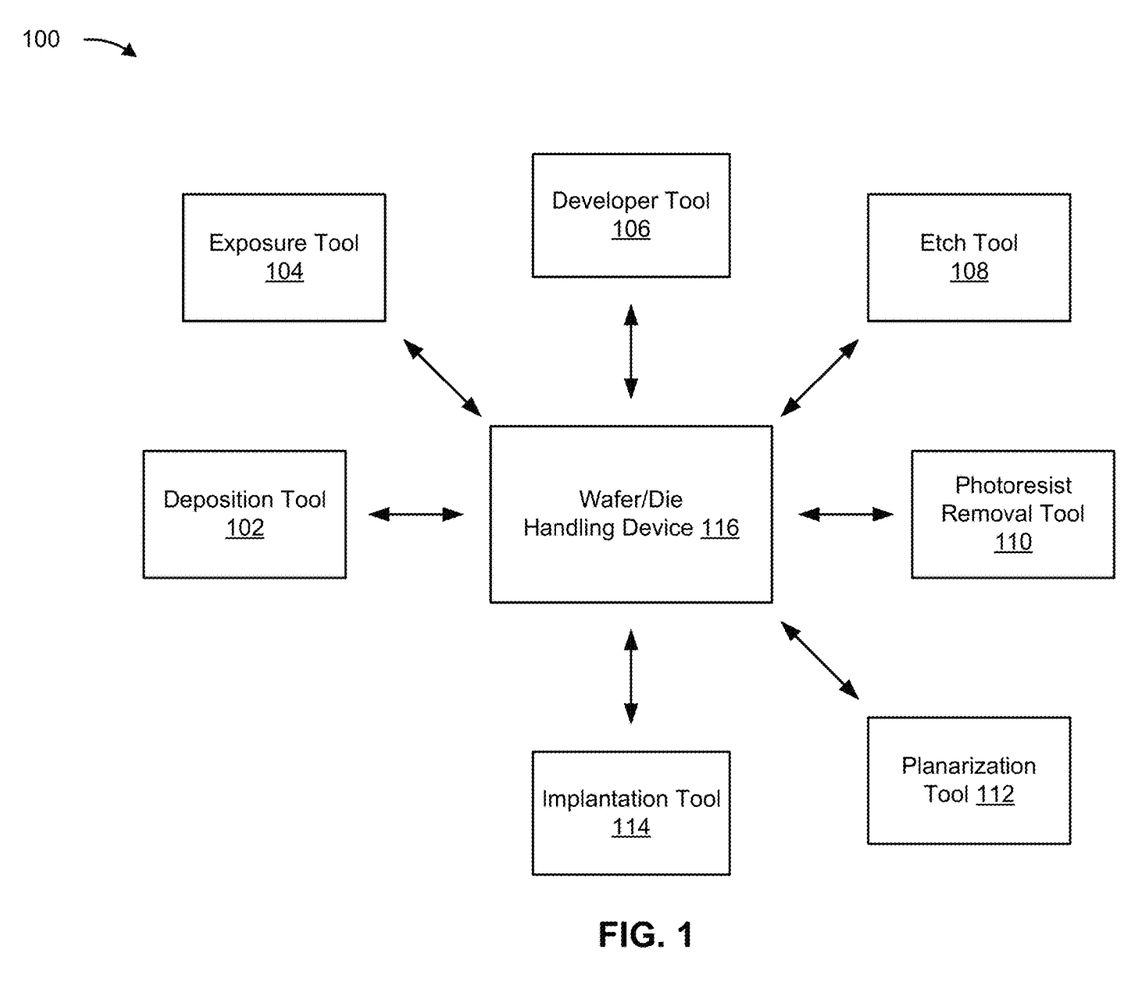
FIG. 1 is a diagram of an example environment in which systems and/or methods described herein may be implemented.

FIG. 1 is a diagram of an example environment 100 in which systems and/or methods described herein may be implemented. As shown in FIG. 1, environment 100 may include a plurality of semiconductor processing tools 102-114 and a wafer/die handling device 116. The plurality of semiconductor processing tools 102-114 may include a deposition tool 102, an exposure tool 104, a developer tool 106, an etch tool 108, a photoresist removal tool 110, a planarization tool 112, an implantation tool 114, and/or another type of semiconductor processing tool. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 may deposit a metal material to form one or more conductors or conductive layers, may deposit an insulating material to form a dielectric or insulating layer, and/or the like as described herein. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotopically or directionally etch the one or more portions.

The photoresist removal tool 110 is a semiconductor processing tool that is capable of removing a portion of a photoresist layer deposited on a substrate. For example, the photoresist removal tool 110 may remove one or more portions of the photoresist layer (e.g., using a chemical stripper and/or another technique) after the etch tool 108 uses the photoresist layer to etch the substrate.

The planarization tool 112 is a semiconductor processing tool that is capable of polishing or planarizing various layers of a wafer or semiconductor device. For example, a polishing device may include a chemical mechanical polishing (CMP) device and/or another type of polishing device. In some implementations, the polishing device may polish or planarize a layer of deposited or plated material. A CMP process may include depositing a slurry (or polishing compound) onto a polishing pad. A wafer may be mounted to a carrier, which may rotate the wafer as the wafer is pressed against the polishing pad. The slurry and polishing pad act as an abrasive that polishes or planarizes one or more layers of the wafer as the wafer is rotated. The polishing pad may also be rotated to ensure a continuous supply of slurry is applied to the polishing pad.

The implantation tool 114 is a semiconductor processing tool that is used to implant ions into a substrate or layer of a semiconductor wafer. In some implementations, the implantation tool 114 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam. In some implementations, the implantation tool 114 can be used in association with forming a bias film, as described herein.

Wafer/die handling device 116 includes a mobile robot, a robot arm, a tram or rail car, and/or another type of device that are used to handle wafers and/or dies and/or transport wafers and/or dies between semiconductor processing tools 102-114 and/or to and from other locations such as a wafer rack, a storage room, and/or the like. In some implementations, wafer/die handling device 116 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
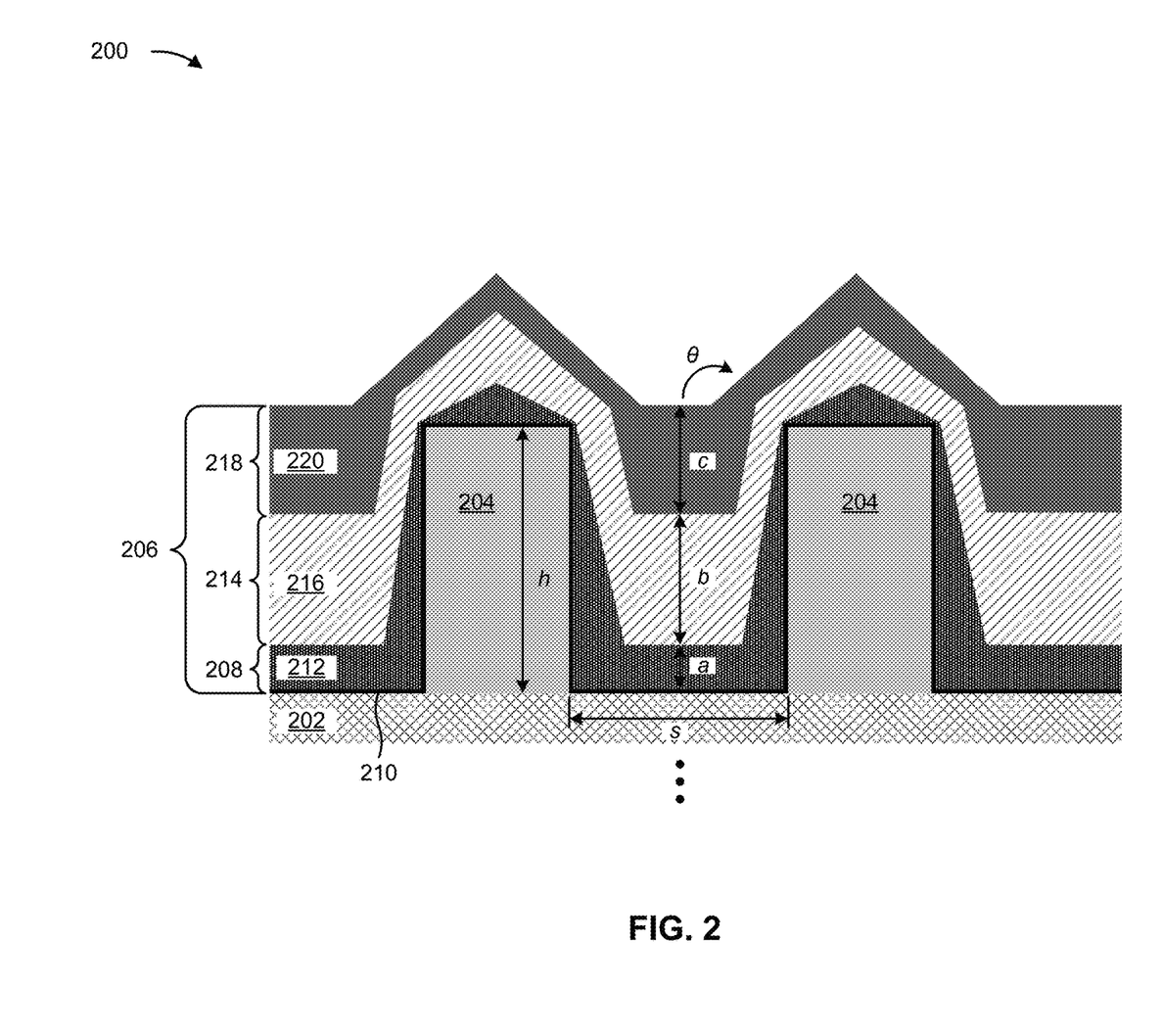
FIG. 2 is a diagram of an example semiconductor device described herein.

FIG. 2 is a diagram of an example semiconductor device 200 described herein. As shown, semiconductor device 200 includes a dielectric layer 202, a UTM structure 204, and a passivation layer 206. As shown, passivation layer 206 includes a first passivation oxide 208 comprising an unbias film 210 and a first bias film 212, a second passivation oxide 214 consisting of a second bias film 216, and a third passivation oxide 218 consisting of a third bias film 220. Here, the first passivation oxide 208 is a dual film (e.g., comprising unbias film 210 and first bias film 212), while the second passivation oxide 214 and the third passivation oxide 218 are single films (including only second bias film 216 and third bias film 220, respectively).

The dielectric layer 202 is a layer on which the UTM structure 204 of the semiconductor device 200 is formed. In some implementations, the dielectric layer 202 may comprise an oxide, such as undoped silicate glass (USG), fluorosilicate glass (FSG), or an oxide material having a low dielectric constant (i.e., a low-K oxide), among other examples. In some implementations, the dielectric layer 202 may be near a top of a layer stack of the semiconductor device 200. For example, the dielectric layer 202 may be a layer below which multiple other layers of the semiconductor device 200 (including one or more other metal layers) are formed. In some implementations, one or more metal vias may pass through the dielectric layer 202 (not shown) to enable portions of the UTM structure 204 to connect to one or more other (lower) metal layers of the semiconductor device 200. In some implementations, the dielectric layer 202 (and the other lower layers of the semiconductor device 200) are on a substrate, such as a semiconductor die substrate, a semiconductor wafer, or another type of substrate in which the semiconductor device 200 may be formed. In some implementations, the substrate may be silicon, a material including silicon, a III-V compound semiconductor material such as gallium arsenide (GaAs), a silicon on insulator (SOI), or another type of semiconductor material.

The UTM structure 204 is a metal layer on the dielectric layer 202. In some implementations, the UTM structure 204 is designed to, for example, reduce a resistance of metal lines (e.g., formed in one or more other metal layers) of the semiconductor device 200. In some implementations, the UTM structure 204 is formed of aluminum copper (AlCu) or another type of metal material, such as aluminum, copper, tungsten, nickel, palladium, or some combination thereof, among other examples. In some implementations, one or more portions of the UTM structure 204 are connected to one or more other (lower) metal layers of the semiconductor device 200 through vias in the dielectric layer 202 (not shown). In some implementations, the UTM structure 204 is formed such that multiple portions of the UTM structure 204 are on the dielectric layer 202 (e.g., two portions are shown in FIG. 2). In some implementations, a height h of a given portion of the UTM structure 204 may be greater than or equal to 30 kiloAngstroms (kÅ). That is, in some implementations, the UTM structure 204 has a thickness that is greater than or equal to 30 kÅ. In some implementations, a spacing s between adjacent portions of the UTM structure 204 may be greater than or equal to approximately 1.8 micrometers (μm).

The passivation layer 206 is a layer to protect the semiconductor device 200. For example, the passivation layer 206 may be designed to protect the UTM structure 204 and/or one or more other (lower) layers of the semiconductor device 200, such as dielectric layer 202. In some implementations, the passivation layer 206 includes a first passivation oxide 208 comprising an unbias film 210 and a first bias film 212. In some implementations, as shown in FIG. 2, the unbias film 210 is on portions of the UTM structure 204 and on portions of a layer on which the UTM structure 204 (e.g., the dielectric layer 202) is formed, and the first bias film 212 is on the unbias film 210. In some implementations, as shown in FIG. 2, the passivation layer 206 includes a second passivation oxide 214 consisting of a second bias film 216, where the second bias film 216 is on the first bias film 212. In some implementations, as shown in FIG. 2, the passivation layer 206 includes a third passivation oxide 218 consisting of a third bias film 220, where the third bias film 220 is on the second bias film 216.

Notably, the passivation layer 206 of the semiconductor device 200 includes three passivation oxides. A passivation layer including a higher number of passivation oxides (e.g., four passivation oxides) creates additional interfaces in the passivation layer, which increases a likelihood of cracking. Further, a passivation layer 206 including a lower number of passivation oxides (e.g., two passivation oxides) requires more process time for formation and, therefore, could induce a process temperature that is higher than a melting point of the UTM structure 204, meaning that the UTM structure 204 could be damaged.

In some implementations, the first passivation oxide 208 is a dual film passivation oxide that includes the unbias film 210 and the first bias film 212. In some implementations, the unbias film 210 protects one or more lower layers of the semiconductor device 200 from damage during formation of one or more other films of the passivation layer 206. For example, the unbias film 210 may serve to prevent damage to the UTM structure 204 during a bombardment etch used in association with forming the first bias film 212, a bombardment etch used in association with forming the second bias film 216, and/or a bombardment etch used in association with forming the third bias film 220. In some implementations, the unbias film 210 comprises an oxide film. In some implementations, a thickness of the unbias film 210 in a region between adjacent portions of the UTM structure 204 is in a range from approximately 700 Å to approximately 1300 Å. The first bias film 212 of the first passivation oxide 208 is formed on the unbias film 210. In some implementations, the first bias film 212 comprises an oxide film having a hydrogen concentration that is less than approximately 1.05%. In some implementations, a thickness (identified as a in FIG. 2) of the first bias film 212 in the region between adjacent portions of the UTM structure 204 is in a range from approximately 5000 Å to approximately 20000 Å.

In some implementations, the second passivation oxide 214 is a single film passivation oxide that includes the second bias film 216. In some implementations, the second bias film 216 is formed on the first bias film 212. In some implementations, the second bias film 216 comprises an oxide film having a hydrogen concentration that is less than approximately 1.05%. Notably, there is no unbias film present between the first bias film 212 and the second bias film 216 in the semiconductor device 200. In some implementations, a thickness (identified as b in FIG. 2) of the second bias film 216 in the region between the adjacent portions of the UTM structure 204 may be in a range from approximately 10000 Å to approximately 25000 Å.

In some implementations, the third passivation oxide 218 is single film passivation oxide that includes the third bias film 220. In some implementations, the third bias film 220 is formed on the second bias film 216. In some implementations, the third bias film 220 comprises an oxide film having a hydrogen concentration that is less than approximately 1.05%. Notably, there is no unbias film present between the second bias film 216 and the third bias film 220 in the semiconductor device 200. In some implementations, a thickness (identified as c in FIG. 2) of the third bias film 220 in the region between the adjacent portions of the UTM structure 204 may be in a range from approximately 5000 Å to approximately 15000 Å.

In some implementations, as illustrated in FIG. 2, a total thickness of the first passivation oxide 208 and the second passivation oxide 214 in a region between adjacent portions of the UTM structure 204 is greater than 50% of the height of a given portion of the UTM structure 204 layer (e.g., $a+b \geq 0.50\ h$). Put another way, in some implementations, a height of an interface between the second passivation oxide 214 and the third passivation oxide 218 in a region over a portion of the dielectric layer 202 in a region adjacent to a portion of the UTM structure 204 is more than 50% of a height of the portion of the UTM structure 204. That is, in some implementations, a height of a surface of the second bias film 216 in the region between the adjacent portions of the UTM structure 204 is greater than a height of a center of a given portion of the UTM structure 204. The total thickness of the first passivation oxide 208 and the second passivation oxide 214 being greater than 50% of the height of the portion of the UTM structure 204 prevents the point of stress concentration of the portion of the UTM structure 204 from being near an interface between the second passivation oxide 214 and the third passivation oxide 218 of the passivation layer 206, thereby reducing a likelihood of cracking of the passivation layer 206.

Further, in some implementations, a height of an interface between the first passivation oxide 208 and the second passivation oxide 214 over the portion of the dielectric layer 202 in the region adjacent to the portion of the UTM structure 204 is less than 50% of the height of the portion of the UTM structure 204. That is, in some implementations, a height of a surface of the first bias film 212 in the region between the adjacent portions of the UTM structure 204 is less than the height of the center of the given portion of the UTM structure 204. The height of the interface between the first passivation oxide 208 and the second passivation oxide 214 being less than 50% of the height of the portion of the UTM structure 204 prevents the point of stress concentration of the portion of the UTM structure 204 from being near an interface between the first passivation oxide 208 and the second passivation oxide 214 of the passivation layer 206, thereby reducing a likelihood of cracking of the passivation layer 206.

In some implementations, a midpoint in the height of the portion of the UTM structure 204 matches or is near a midpoint of a thickness of the second passivation oxide 214 in the region over the portion of the dielectric layer 202. The midpoint in the height of the portion of the UTM structure 204 matching or being near the midpoint of the thickness of the second passivation oxide 214 in the region over the portion of the dielectric layer 202 means that no film interface is near the point of stress concentration of the portion of the UTM structure 204, thereby reducing a likelihood of cracking of the passivation layer 206.

In some implementations, a total thickness of the first passivation oxide 208, the second passivation oxide 214, and the third passivation oxide 218 between the adjacent portions of the UTM structure 204 is greater than the height of a given portion of the UTM structure 204 (e.g., $a+b+c>h$, as shown in FIG. 2). Put another way, in some implementations, a total thickness of the first passivation oxide 208, the second passivation oxide 214, and the third passivation oxide 218 over a portion of the dielectric layer 202 in a region adjacent to the portion of the UTM structure 204 is greater than the height of the portion of the UTM structure 204. That is, in some implementations, a height of a surface of the third bias film 220 in a region between adjacent portions of the UTM structure 204 is greater than a height of a given portion of the UTM structure 204. The total thickness of the first passivation oxide 208, the second passivation oxide 214, and the third passivation oxide 218 between the adjacent portions of the UTM structure 204 being greater than the height of the portion of the UTM structure 204 reduces a likelihood that the portion of the UTM structure 204 is damaged (e.g., during a subsequent semiconductor processing step). That is, the thickness of the passivation layer 206 between the adjacent portions of the UTM structure 204 being greater than the height of a given portion of the UTM structure 204 may serve to protect the UTM structure 204 from damage.

In some implementations, the passivation layer 206 (e.g., the surface of the third passivation oxide 218/third bias film 220) has a profile angle θ of at least approximately 110 degrees in a region between the adjacent portions of the UTM structure 204. The profile angle θ may be defined by as an angle between a portion of a surface of the passivation layer 206 over an approximate middle of a gap between portions of the UTM structure 204 and a portion of the surface of the passivation layer 206 over an edge of a portion of the UTM structure 204. The passivation layer 206 having the profile angle θ of at least approximately 110 degrees in the region between the adjacent portions of the UTM structure 204 reduces stress in the passivation layer 206, thereby reducing a likelihood of cracking of the passivation layer 206.

In some implementations, a thickness of the first passivation oxide 208 is less than or equal to approximately 80% of a thickness of the second passivation oxide 214 in the region between adjacent portions of the UTM structure 204. That is, in some implementations, a ratio of a total thickness of the unbias film 210 and the first bias film 212 in a region between adjacent portions of the UTM structure 204 to a thickness of the second bias film 216 in the region between the adjacent portions of the UTM structure 204 is less than or equal to approximately 0.8. Further, in some implementations, a thickness of the third passivation oxide 218 is less than or equal to approximately 80% of a thickness of the second passivation oxide 214 in the region between the adjacent portions of the UTM structure 204. That is, in some implementations, a ratio of a thickness of the third bias film 220 in a region between adjacent portions of the UTM structure 204 to a thickness of the second bias film 216 in the region between the adjacent portions of the UTM structure 204 is less than or equal to approximately 0.8. Thus, in some implementations, a thickness of the second passivation oxide 214 in the region over the portion of the dielectric layer 202 is greater than a thickness of the first passivation oxide 208 in the region over the portion of the dielectric layer 202 and is greater than a thickness of the third passivation oxide 218 in the region over the portion of the dielectric layer 202. In some implementations, a thickness of the third passivation oxide 218 is less than or equal to a thickness of the first passivation oxide 208 in the region between the adjacent portions of the UTM structure 204. That is, in some implementations, a ratio of a thickness of the third bias film 220 in a region between adjacent portions of the UTM structure 204 to a total thickness of the unbias film 210 and the first bias film 212 in the region between the adjacent portions of the UTM structure 204 is less than or equal to approximately 1.0. In some implementations, such relationships of thicknesses of films of the passivation layer 206 prevents interfaces between a given pair of films from being near a midpoint of the height h (i.e., the point of stress concentration), thereby reducing a likelihood of cracking of the passivation layer 206.

The number and arrangement of structures, layers, or the like shown in FIG. 2 are provided as examples. In practice, a semiconductor device may include additional structures and/or layers; fewer structures and/or layers; different structures and/or layers; and/or differently arranged structures and/or layers than those shown in FIG. 2. For example, passivation layer 206 may in some implementations include a different number of passivation oxides (e.g., two passivation oxides, four passivation oxides, or the like). That is, as indicated above, FIG. 2 is provided as an example, and other examples may differ from what is described with regard to FIG. 2.

FIGS. 3A-3E are diagrams of an example of forming the semiconductor device 200 described herein. In some implementations, the one or more semiconductor processing tools 102-114 may perform one or more of the techniques and/or processes described in connection with FIGS. 3A-3E. In some implementations, one or more of the techniques and/or processes described in connection with FIGS. 3A-3E may be performed by other semiconductor processing tools.

Figure 3A:
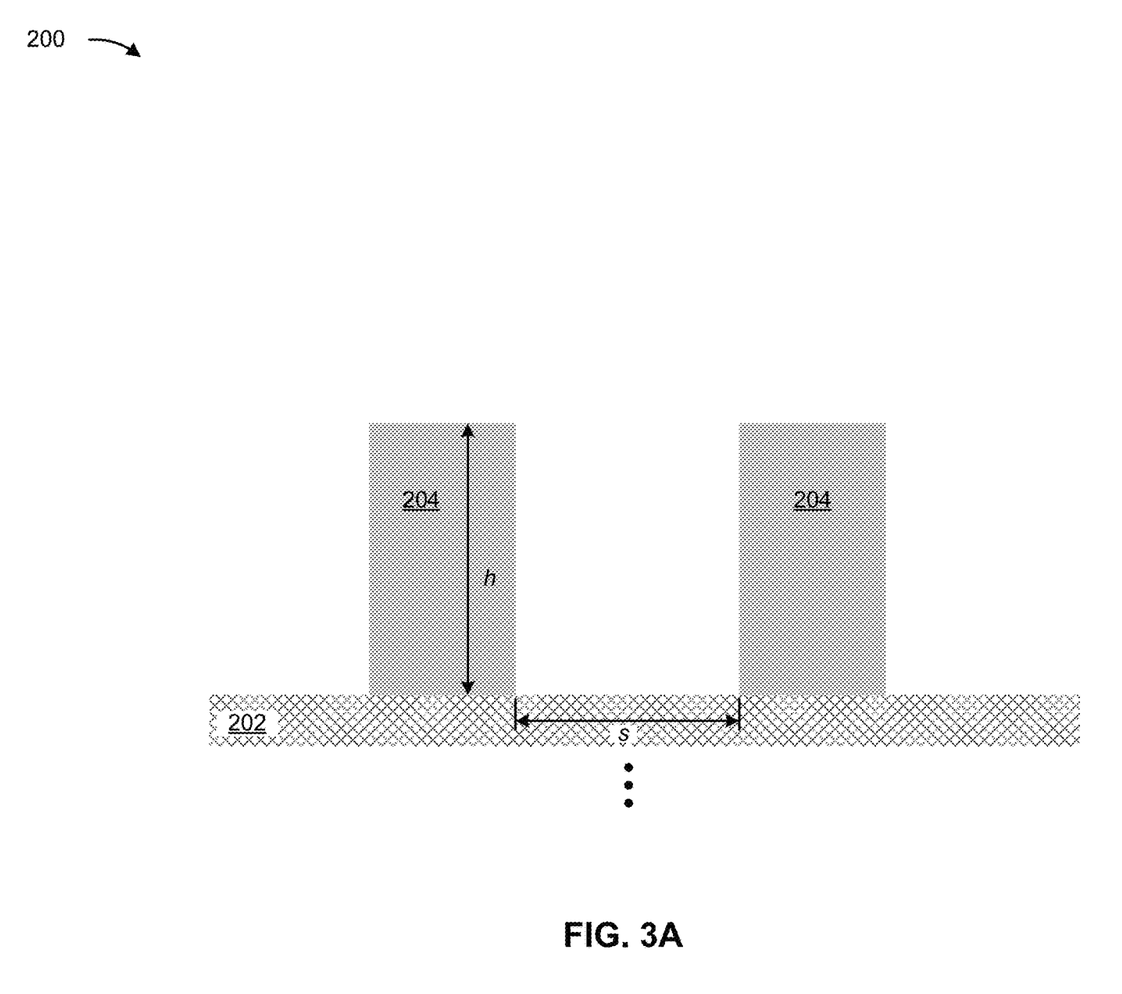
FIGS. 3A-3E are diagrams of an example of forming a semiconductor device described herein.

As shown in FIG. 3A, a portion of the semiconductor device 200 including the dielectric layer 202 and the UTM structure 204 is formed. For example, a group of structures, elements, and/or layers may be formed on a substrate, where the dielectric layer 202 is a top-most layer in this group. In some implementations, one or more of the semiconductor processing tools 102-114 may form the portion of the semiconductor device 200 up to the dielectric layer 202. The UTM structure 204 may then be formed on the dielectric layer 202. In some implementations, to form the UTM structure 204, the deposition tool 102 may deposit a photoresist layer on the UTM material (e.g., by a spin coating operation). The exposure tool 104 may form a pattern in the photoresist layer by exposing the photoresist layer to a radiation source, such as a UV source (e.g., a deep UV light source, an extreme UV (EUV) light source, and/or the like), an x-ray source, or an electron beam (e-beam) source, to transfer the pattern from a photomask to the photoresist layer. The developer tool 106 may perform a development operation that includes one or more techniques to develop the pattern in the photoresist layer. The etch tool 108 may etch the UTM material based on the pattern formed in the photoresist layer to form the UTM structure 204. For example, the etch tool 108 may perform a wet etching technique (e.g., where the UTM structure 204 is exposed or submerged in a chemical that etches or removes material at a particular etch rate), a dry etching device (e.g., where a plasma is used to sputter material), or another type of etching technique. The remaining portions of the photoresist layer may be removed after the UTM material is etched to form the UTM structure 204.

Figure 3B:
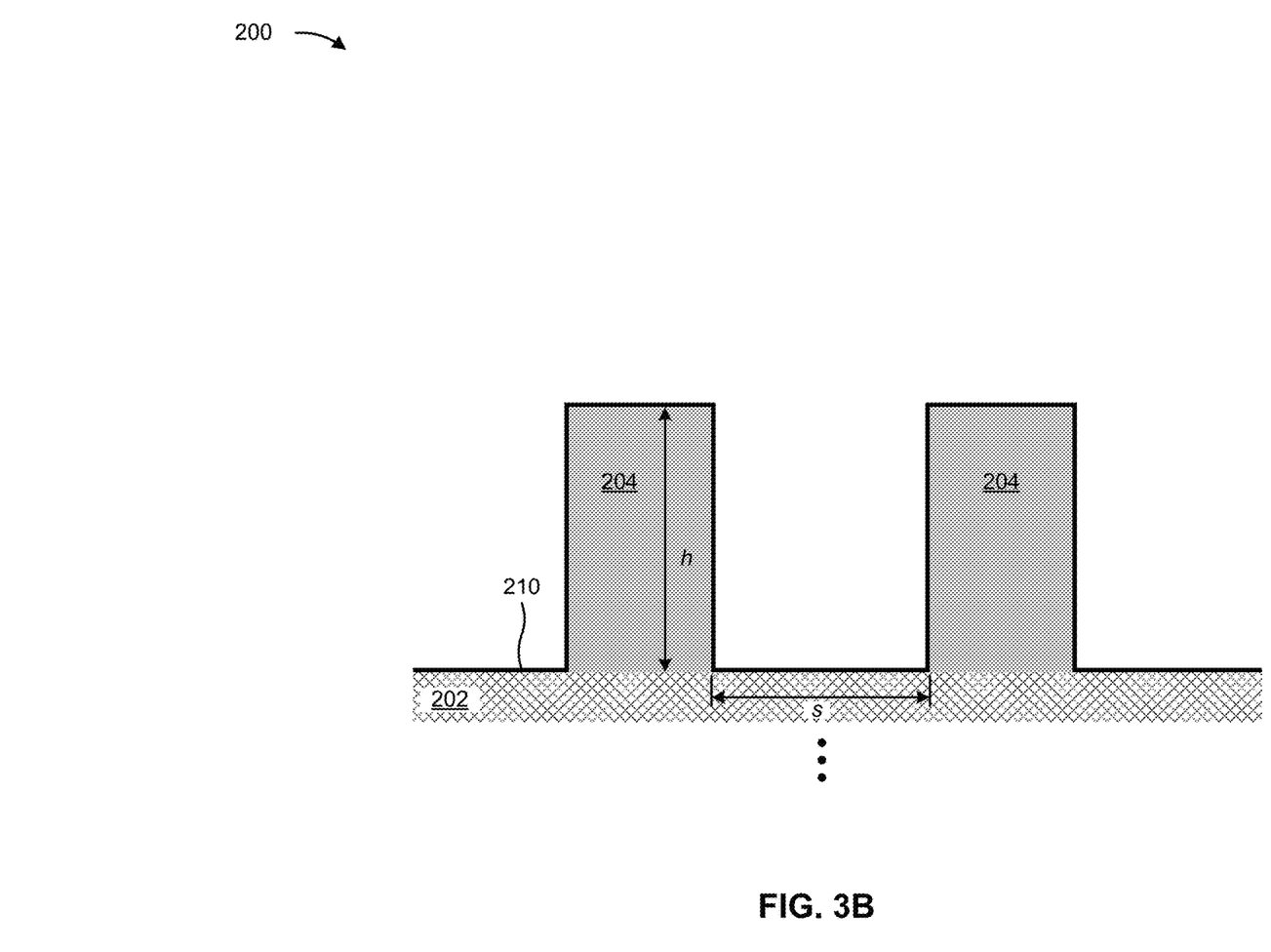

As shown by FIG. 3B, the unbias film 210 is formed on the UTM structure 204 and on portions of the dielectric layer 202 (i.e., the layer of the semiconductor device 200 on which the UTM structure 204) is formed. For example, the deposition tool 102 may deposit the unbias film 210 over the UTM structure 204 and the portions of the dielectric layer 202 using a CVD process, a PVD process, an ALD process, or another type of deposition process.

Figure 3C:
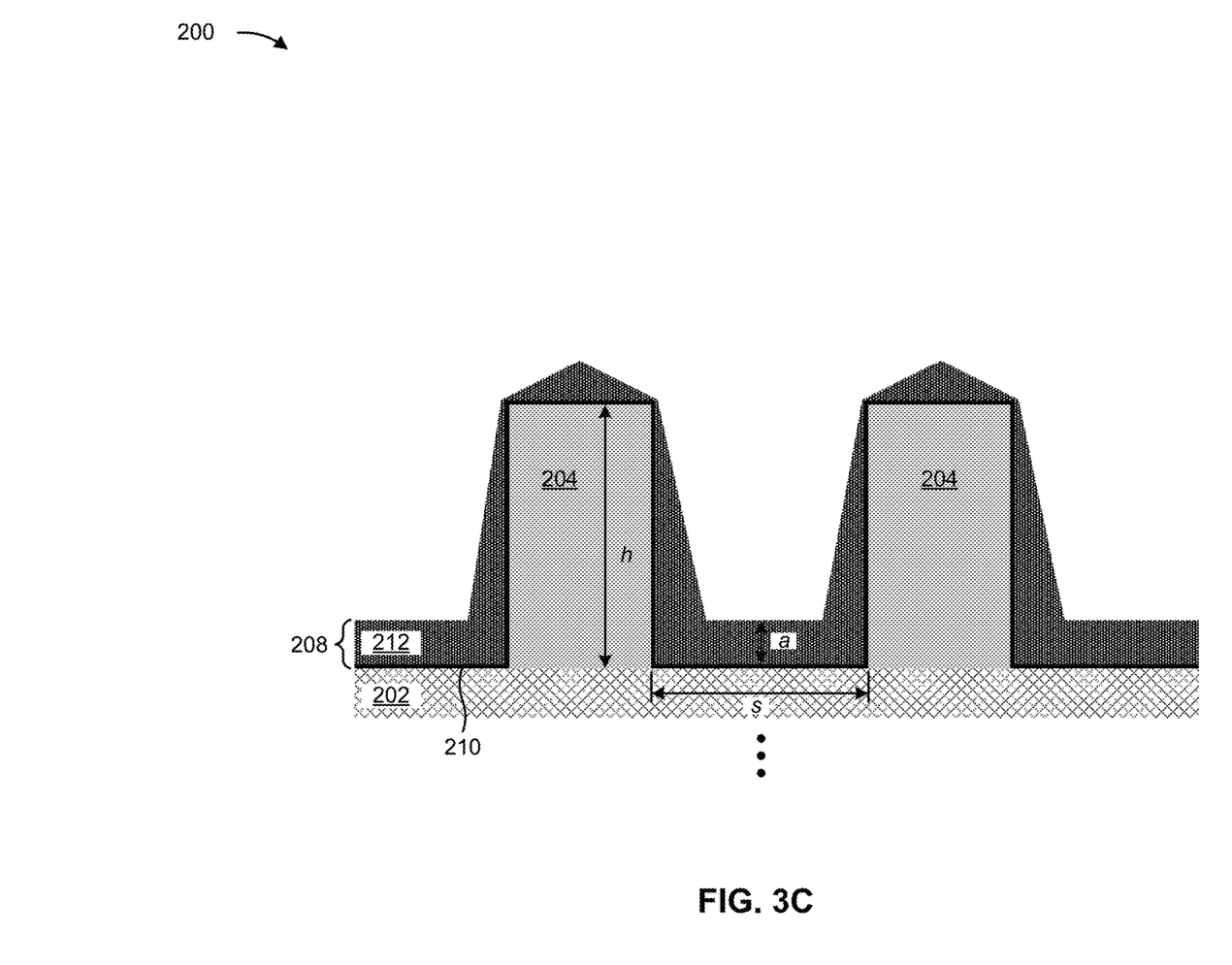

As shown by FIG. 3C, the first bias film 212 is formed on the unbias film 210. For example, the deposition tool 102 may deposit an oxide film material over the unbias film 210 using a CVD process, a PVD process, an ALD process, or another type of deposition process. Next, the etch tool 108 may bombard the deposited oxide film material in order to perform a sputter etch of the oxide film material with plasma to form the first bias film 212. Here, the etch tool 108 uses an electric field bias to accelerate ions that bombard the deposited oxide film material to perform the sputter etching. In some implementations, the etch tool 108 may bombard the oxide film material after the deposition tool 102 deposits the oxide film material. Alternatively, in some implementations, the etch tool 108 may bombard the oxide film material while (e.g., concurrently with) the deposition tool 102 deposits the oxide film material. In some implementations, the use of bombardment to form the first bias film 212 improves fill performance of the first bias film 212 in the region between the adjacent portions of the UTM structure 204 (e.g., by etching the oxide film material at upper corners of the UTM structure 204 layer to prevent a void from being formed). Notably, the unbias film 210 protects the UTM structure 204 from damage during the bombardment associated with forming the first bias film 212.

Figure 3D:
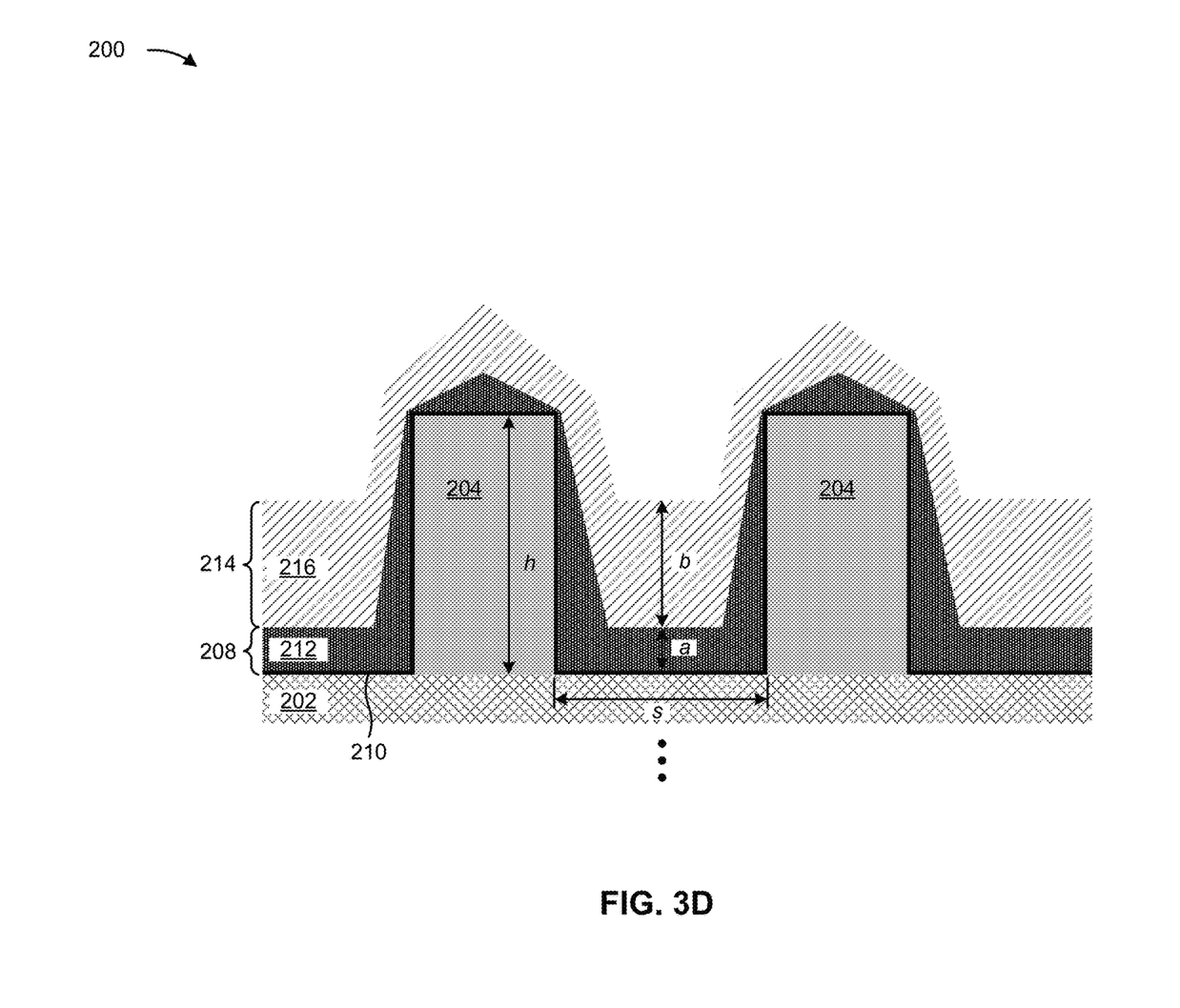

As shown by FIG. 3D, the second bias film 216 is formed on the first bias film 212. For example, the deposition tool 102 may deposit an oxide film material over the first bias film 212 using a CVD process, a PVD process, an ALD process, or another type of deposition process. Next, the etch tool 108 may bombard the deposited oxide film material in order to perform a sputter etch of the oxide film material with plasma to form the second bias film 216. Here, the etch tool 108 uses an electric field bias to accelerate ions that bombard the deposited oxide film material to perform the sputter etching. In some implementations, the etch tool 108 may bombard the oxide film material after the deposition tool 102 deposits the oxide film material. Alternatively, in some implementations, the etch tool 108 may bombard the oxide film material while (e.g., concurrently with) the deposition tool 102 deposits the oxide film material. In some implementations, the use of bombardment to form the second bias film 216 improves fill performance of the second bias film 216 in the region between the adjacent portions of the UTM structure 204 (e.g., by etching the oxide film material at upper corners of the UTM structure 204 to prevent a void from being formed). Notably, the unbias film 210 below the first bias film 212 protects the UTM structure 204 from damage during the bombardment associated with forming the second bias film 216. Thus, the structure of the semiconductor device 200 is not adversely impacted by the lack of an unbias film being present on the first bias film 212 before formation of the second bias film 216.

Figure 3E:
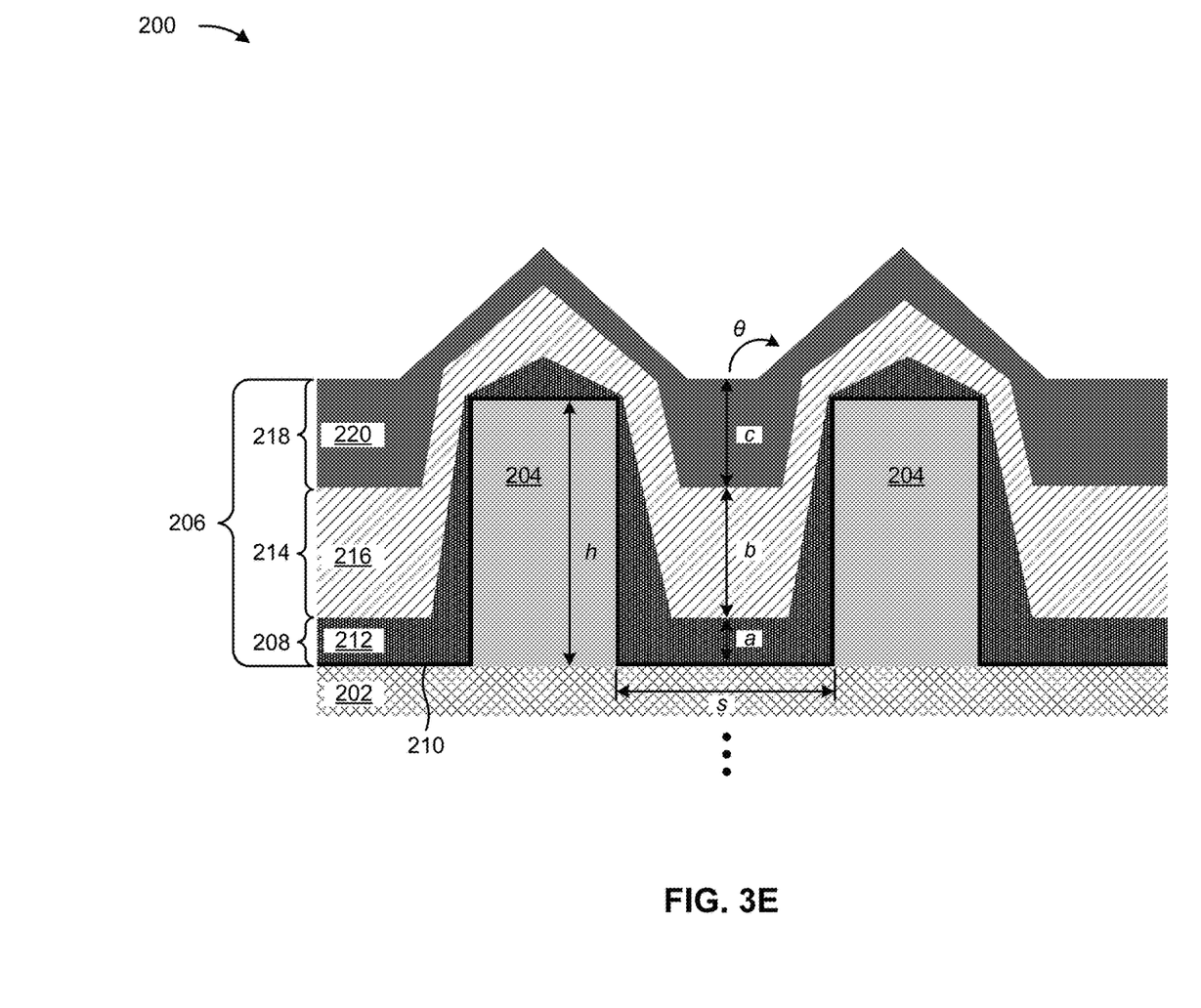

As shown by FIG. 3E, the third bias film 220 is formed on the second bias film 216. For example, the deposition tool 102 may deposit an oxide film material over the second bias film 216 using a CVD process, a PVD process, an ALD process, or another type of deposition process. Next, the etch tool 108 may bombard the deposited oxide film material in order to perform a sputter etch of the oxide film material with plasma to form the third bias film 220. Here, the etch tool 108 uses an electric field bias to accelerate ions that bombard the deposited oxide film material to perform the sputter etching. In some implementations, the etch tool 108 may bombard the oxide film material after the deposition tool 102 deposits the oxide film material. Alternatively, in some implementations, the etch tool 108 may bombard the oxide film material while (e.g., concurrently with) the deposition tool 102 deposits the oxide film material. In some implementations, the use of bombardment to form the third bias film 220 improves fill performance of the second bias film 216 in the region between the adjacent portions of the UTM structure 204 (e.g., by etching the oxide film material at upper corners of the UTM structure 204 layer to prevent a void from being formed). Notably, the unbias film 210 below the first bias film 212 and the second bias film 216 protects the UTM structure 204 from damage during the bombardment associated with forming the third bias film 220. Thus, the structure of the semiconductor device 200 is not adversely impacted by the lack of an unbias film being present on the second bias film 216 before formation of the third bias film 220.

The number and arrangement of structures, layers, or the like shown in FIGS. 3A-3E are provided as examples. In practice, a semiconductor device may include additional structures and/or layers; fewer structures and/or layers; different structures and/or layers; and/or differently arranged structures and/or layers than those shown in FIGS. 3A-3E. That is, as indicated above, FIGS. 3A-3E are provided as an example, and other examples may differ from what is described with regard to FIGS. 3A-3E.

Figure 4:
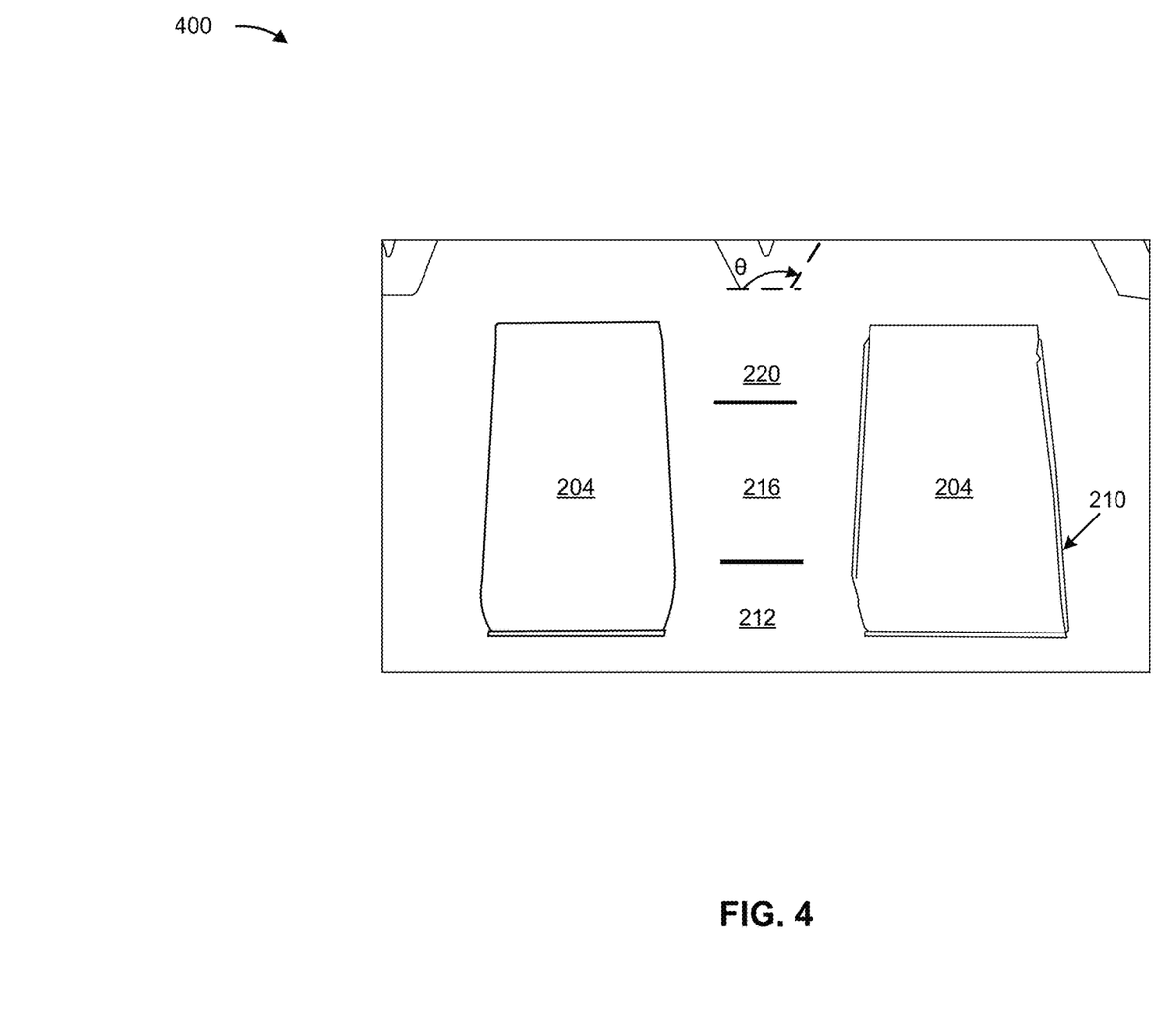
FIG. 4 is a portion of an image of a cross-section of an actual semiconductor device including the passivation layer described herein.

FIG. 4 is a portion of an image of a cross-section of an actual semiconductor device 200 including the passivation layer 206. As can be seen in FIG. 4, in some implementations, a surface of one or more layers of the semiconductor device 200 may in some areas have a slight curvature (i.e., not be perfectly planar). FIG. 4 is provided as an example, and other examples may differ from what is described with regard to FIG. 4.

Figure 5:
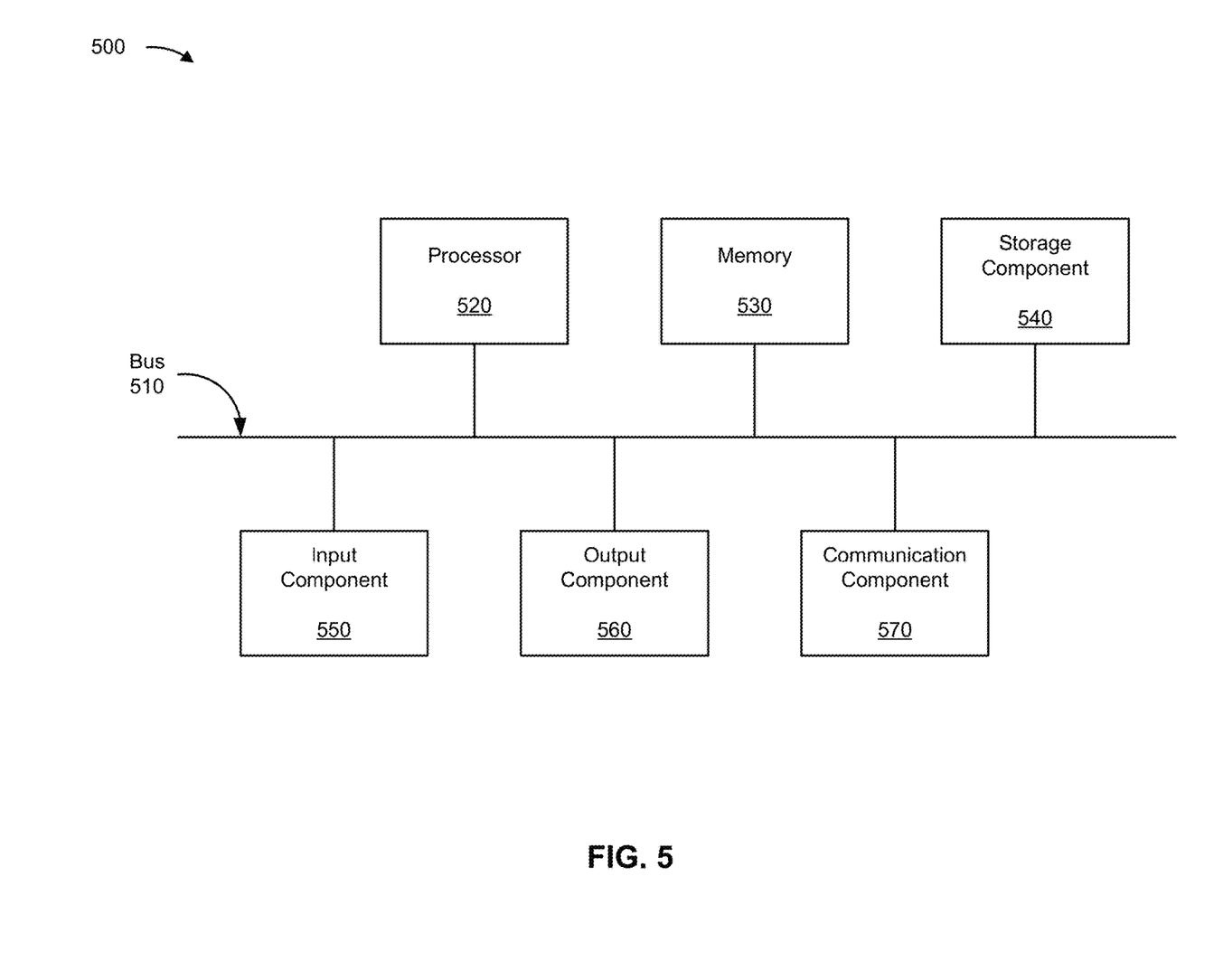
FIG. 5 is a diagram of example components of one or more devices of FIG. 1.

FIG. 5 is a diagram of example components of a device 500, which may correspond to one or more semiconductor processing tools 102-114 and/or wafer/die handling device 116. In some implementations, semiconductor processing tools 102-114 and/or wafer/die handling device 116 may include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, and/or an actuator. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, and/or an antenna.

Device 500 may perform one or more processes described herein. For example, a non-transitory computer-readable medium (e.g., memory 530 and/or storage component 540) may store a set of instructions (e.g., one or more instructions, code, software code, and/or program code) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
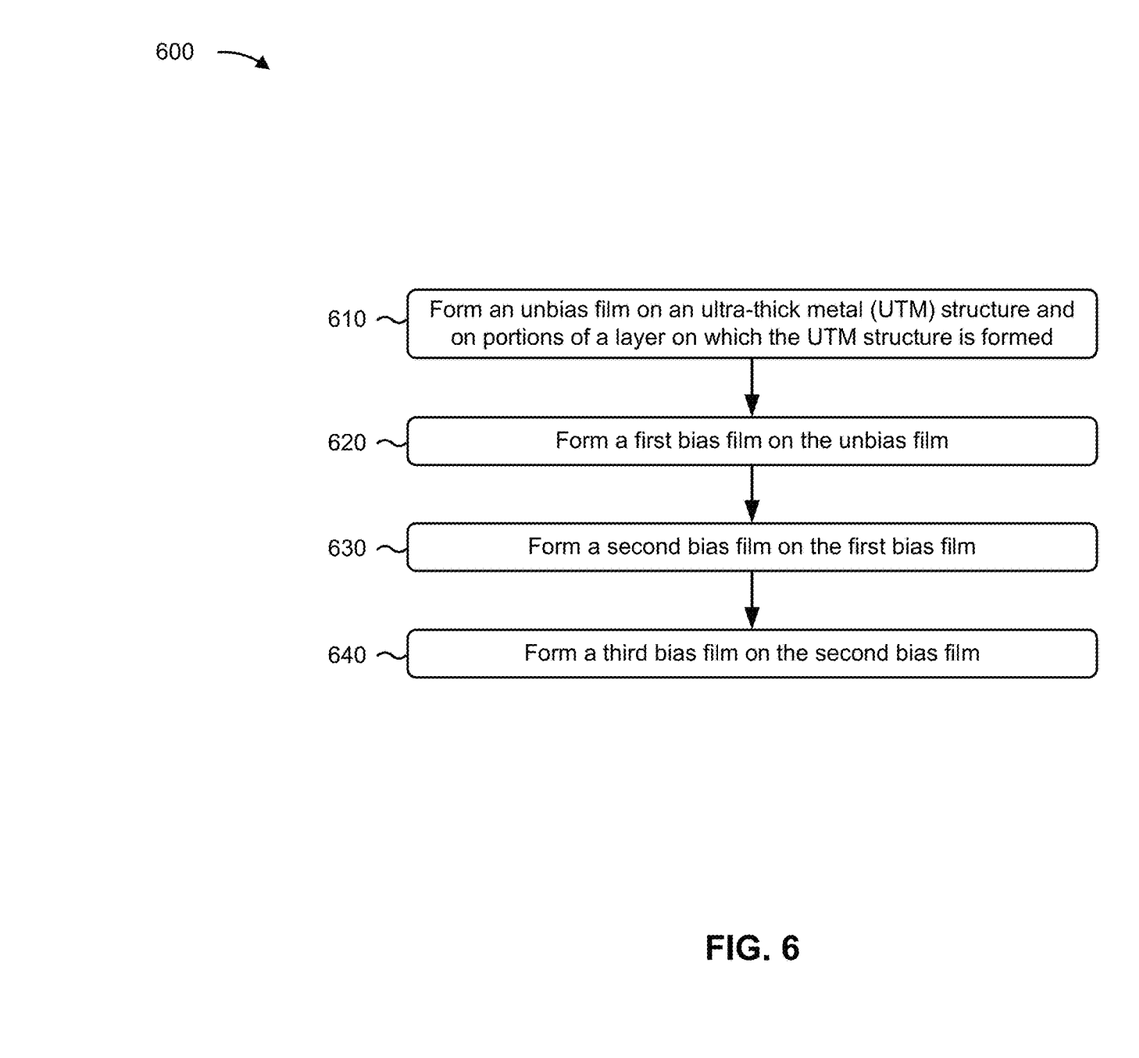
FIG. 6 is a flowchart of an example process relating to forming a semiconductor device described herein.

FIG. 6 is a flowchart of an example process 600 relating to forming semiconductor device 200. In some implementations, one or more process blocks of FIG. 6 may be performed by one or more semiconductor processing tools (e.g., one or more of the semiconductor processing tools 102-114 described above). Additionally, or alternatively, one or more process blocks of FIG. 6 may be performed by one or more components of device 500, such as processor 520, memory 530, storage component 540, input component 550, output component 560, and/or communication component 570.

As shown in FIG. 6, process 600 may include forming an unbias film on a UTM structure of a semiconductor device and on portions of a layer of the semiconductor device on which the UTM structure is formed (block 610). For example, the one or more semiconductor processing tools may form an unbias film 210 on UTM structure 204 of the semiconductor device 200 and on portions of a dielectric layer 202 of the semiconductor device 200 on which the UTM structure 204 is formed, as described above.

As further shown in FIG. 6, process 600 may include forming a first bias film on the unbias film (block 620). For example, the one or more semiconductor processing tools may form a first bias film 212 on the unbias film, as described above.

As further shown in FIG. 6, process 600 may include forming a second bias film on the first bias film (block 630). For example, the one or more semiconductor processing tools may form a second bias film 216 on the first bias film 212, as described above.

As further shown in FIG. 6, process 600 may include forming a third bias film on the second bias film (block 640). For example, the one or more semiconductor processing tools may form a third bias film 220 on the second bias film 216, as described above.

Process 600 may include additional implementations, such as any single implementation or any combination of implementations described below and/or in connection with one or more other processes described elsewhere herein.

In a first implementation, a height of a surface of the second bias film 216 in a region between adjacent portions of the UTM structure 204 is higher than a midpoint of a height h of a given portion of the UTM structure 204.

In a second implementation, alone or in combination with the first implementation, a height of a surface of the third bias film 220 in a region between adjacent portions of the UTM structure 204 is greater than a height h of a given portion of the UTM structure 204.

In a third implementation, alone or in combination with one or more of the first and second implementations, a surface of the third bias film 220 has profile angle θ of at least approximately 110 degrees in a region between adjacent portions of the UTM structure 204.

In a fourth implementation, alone or in combination with one or more of the first through third implementations, a ratio of a total thickness of the unbias film 210 and the first bias film 212 in a region between adjacent portions of the UTM structure 204 to a thickness of the second bias film 216 in the region between the adjacent portions of the UTM structure 204 is less than or equal to approximately 0.8.

In a fifth implementation, alone or in combination with one or more of the first through fourth implementations, a ratio of a thickness of the third bias film 220 in a region between adjacent portions of the UTM structure 204 to a thickness of the second bias film 216 in the region between the adjacent portions of the UTM structure 204 is less than or equal to approximately 0.8.

In a sixth implementation, alone or in combination with one or more of the first through fifth implementations, a ratio of a thickness of the third bias film 220 in a region between adjacent portions of the UTM structure 204 to a total thickness of the unbias film 210 and the first bias film 212 in the region between the adjacent portions of the UTM structure 204 is less than or equal to approximately 1.0.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, a passivation layer may have a structure that reduces a number of interfaces between films and/or may include interfaces between films that are relatively far from a point of stress concentration. As a result, a likelihood of cracking in the passivation layer is reduced, thereby increasing a yield associated with manufacturing the semiconductor device. Further, in some implementations, the passivation layer has a structure that reduces a likelihood of the portions of the UTM structure being damage during a subsequent semiconductor processing step.

As described in greater detail above, some implementations described herein provide a semiconductor device. The semiconductor device includes a UTM structure. The semiconductor device includes a passivation layer including a first passivation oxide including an unbias film and a first bias film, where the unbias film is on portions of the UTM structure and on portions of a layer on which the UTM structure is formed, and the first bias film is on the unbias film. The passivation layer includes a second passivation oxide consisting of a second bias film, the second bias film being on the first bias film. The passivation layer includes a third passivation oxide consisting of a third bias film, the third bias film being on the second bias film.

As described in greater detail above, some implementations described herein provide a method. The method includes forming an unbias film on a UTM structure of a semiconductor device and on portions of a layer of the semiconductor device on which the UTM structure is formed. The method includes forming a first bias film on the unbias film. The method includes forming a second bias film on the first bias film. The method includes forming a third bias film on the second bias film.

As described in greater detail above, some implementations described herein provide a semiconductor device. The semiconductor device includes a passivation layer including a first passivation oxide consisting of an unbias film and a first bias film, where the unbias film is on a portion of a UTM structure and on a portion of another layer in a region adjacent to the portion of the UTM structure. The passivation layer includes a second passivation oxide consisting of a second bias film, the second bias film being on the first bias film. The passivation layer includes a third passivation oxide consisting of a third bias film, the third bias film being on the second bias film, where a height of an interface between the second passivation oxide and the third passivation oxide in a region over the portion of the other layer is at least 50% of a height of the portion of the UTM structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
an ultra-thick metal (UTM) structure; and
a passivation layer including:
a first passivation oxide comprising an unbias film and a first bias film, wherein the unbias film is on portions of the UTM structure and on portions of a layer on which the UTM structure is formed, and the first bias film is on the unbias film;

a second passivation oxide consisting of a second bias film, the second bias film being on the first bias film; and a third passivation oxide consisting of a third bias film, the third bias film being on the second bias film.

2. The semiconductor device of claim 1, wherein a total thickness of the first passivation oxide and the second passivation oxide in a region between adjacent portions of the UTM structure is greater than 50% of a height of a given portion of the UTM structure.

3. The semiconductor device of claim 1, wherein a total thickness of the first passivation oxide, the second passivation oxide, and the third passivation oxide between adjacent portions of the UTM structure is greater than a height of a given portion of the UTM structure.

4. The semiconductor device of claim 1, wherein the passivation layer has a profile angle of at least approximately 110 degrees in a region between adjacent portions of the UTM structure, where the profile angle is an angle between a portion of a surface of the passivation layer over an approximate middle of a gap between the adjacent portions of the UTM structure and a portion of the surface of the passivation layer over an edge of one of the adjacent portions of the UTM structure.

5. The semiconductor device of claim 1, wherein a thickness of the first passivation oxide is less than or equal to approximately 80% of a thickness of the second passivation oxide in a region between adjacent portions of the UTM structure.

6. The semiconductor device of claim 1, wherein a thickness of the third passivation oxide is less than or equal to approximately 80% of a thickness of the second passivation oxide in a region between adjacent portions of the UTM structure.

7. The semiconductor device of claim 1, wherein a thickness of the third passivation oxide is less than or equal to a thickness of the first passivation oxide in a region between adjacent portions of the UTM structure.

8. A method, comprising:
forming an unbias film on an ultra-thick metal (UTM) structure of a semiconductor device and on portions of a layer of the semiconductor device on which the UTM structure is formed;
forming a first bias film on the unbias film;
forming a second bias film on the first bias film; and
forming a third bias film on the second bias film.

9. The method of claim 8, wherein a height of a surface of the second bias film in a region between adjacent portions of the UTM structure is higher than a midpoint of a height of a given portion of the UTM structure.

10. The method of claim 8, wherein a height of a surface of the third bias film in a region between adjacent portions of the UTM structure is greater than a height of a given portion of the UTM structure.

11. The method of claim 8, wherein a surface of the third bias film has profile angle of at least approximately 110 degrees in a region between adjacent portions of the UTM structure.

12. The method of claim 8, wherein a ratio of a total thickness of the unbias film and the first bias film in a region between adjacent portions of the UTM structure to a thickness of the second bias film in the region between the adjacent portions of the UTM structure is less than or equal to approximately 0.8.

13. The method of claim 8, wherein a ratio of a thickness of the third bias film in a region between adjacent portions of the UTM structure to a thickness of the second bias film in the region between the adjacent portions of the UTM structure is less than or equal to approximately 0.8.

14. The method of claim 8, wherein a ratio of a thickness of the third bias film in a region between adjacent portions of the UTM structure to a total thickness of the unbias film and the first bias film in the region between the adjacent portions of the UTM structure is less than or equal to approximately 1.0.

15. A semiconductor device, comprising:
a passivation layer comprising:
a first passivation oxide consisting of an unbias film and a first bias film,
wherein the unbias film is on a portion of an ultra-thick metal (UTM) structure and on a portion of another layer in a region adjacent to the portion of the UTM structure;
a second passivation oxide consisting of a second bias film, the second bias film being on the first bias film; and
a third passivation oxide consisting of a third bias film, the third bias film being on the second bias film,
wherein a height of an interface between the second passivation oxide and the third passivation oxide in a region over the portion of the other layer is more than 50% of a height of the portion of the UTM structure.

16. The semiconductor device of claim 15, wherein a total thickness of the first passivation oxide, the second passivation oxide, and the third passivation oxide over the portion of the other layer is greater than a height of the portion of the UTM structure.

17. The semiconductor device of claim 15, wherein the passivation layer has a profile angle of at least approximately 110 degrees over the portion of the other layer.

18. The semiconductor device of claim 15, wherein a height of an interface between the first passivation oxide and the second passivation oxide over the portion of the other layer is less than 50% of the height of the portion of the UTM structure.

19. The semiconductor device of claim 15, wherein a midpoint in a height of the portion of the UTM structure matches a midpoint of a thickness of the second passivation oxide in the region over the portion of the other layer.

20. The semiconductor device of claim 15, wherein a thickness of the second passivation oxide in the region over the portion of the other layer is greater than a thickness of the first passivation oxide in the region over the portion of the other layer and is greater than a thickness of the third passivation oxide in the region over the portion of the other layer.

* * * * *